United States Patent
Doris et al.

(10) Patent No.: US 11,674,829 B2
(45) Date of Patent: Jun. 13, 2023

(54) LOW-POWER SENSOR MEMORY

(71) Applicant: PALO ALTO RESEARCH CENTER INCORPORATED, Palo Alto, CA (US)

(72) Inventors: Sean E. Doris, San Francisco, CA (US); Kent Evans, Sunnyvale, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 643 days.

(21) Appl. No.: 16/726,192

(22) Filed: Dec. 23, 2019

(65) Prior Publication Data

US 2021/0190551 A1 Jun. 24, 2021

(51) Int. Cl.

| | |
|---|---|
| *G01D 9/00* | (2006.01) |
| *G01N 27/00* | (2006.01) |
| *G01D 9/02* | (2006.01) |
| *G01N 27/416* | (2006.01) |
| *G11C 13/02* | (2006.01) |
| *H01B 1/02* | (2006.01) |
| *H01B 1/06* | (2006.01) |

(52) U.S. Cl.
CPC ............. *G01D 9/02* (2013.01); *G01N 27/416* (2013.01); *G11C 13/02* (2013.01); *H01B 1/02* (2013.01); *H01B 1/06* (2013.01)

(58) Field of Classification Search
CPC .......... G01D 9/02; G01N 27/04; G01N 27/22; G01N 27/416; G11C 13/02; H01B 1/00; H01B 1/124; H01B 1/127
See application file for complete search history.

(56) References Cited

U.S. PATENT DOCUMENTS

| | | | | |
|---|---|---|---|---|
| 4,945,257 A * | 7/1990 | Marrocco, III | ........ | H01G 11/56 338/80 |
| 4,965,151 A * | 10/1990 | Takada | ..................... | H01M 4/54 429/219 |
| 6,224,745 B1 * | 5/2001 | Baltruschat | ........ | G01N 27/4045 205/780 |
| 8,758,584 B2 * | 6/2014 | Kahn | ................... | G01N 27/302 324/438 |
| 11,231,387 B2 * | 1/2022 | Ross | .................... | G01N 27/407 |
| 2004/0256644 A1 | 12/2004 | Kugler et al. | | |
| 2006/0076413 A1 | 4/2006 | Kund et al. | | |

(Continued)

FOREIGN PATENT DOCUMENTS

GB 1331241 9/1973
WO WO 2019/243596 * 12/2019

OTHER PUBLICATIONS

Cai et al "Highly stable transparent conductive silver grid/PEDOT:PSS electrodes for integrated bifunctional flexible electrochromic supercapacitors", Adv. Energy Mater. 2016, 6, 1501882 (8 pages).*

(Continued)

*Primary Examiner* — Mark Kopec
(74) *Attorney, Agent, or Firm* — MH2 Technology Law Group LLP

(57) ABSTRACT

A sensor system includes a sensor configured to measure a parameter. The sensor system also includes a memory configured to record one or more occurrences when the parameter is outside of a predetermined range. The memory includes a wire, a counter-electrode, and an electrolyte.

27 Claims, 6 Drawing Sheets

(56) References Cited

U.S. PATENT DOCUMENTS

2010/0184062 A1* 7/2010 Steinmuller-Nethl ........................ G01N 33/5438
435/6.19
2015/0332141 A1 11/2015 Johnson et al.

OTHER PUBLICATIONS

Extended European Search Report dated May 25, 2021 in corresponding European Application No. 20212022.6, 12 pages.
3M™ MonitorMark™ Time Temperature Indicators product page, downloaded Dec. 12, 2019 from https://www.3m.com/3M/en_US/company-us/all-3m-products/~/MONMARK-3M-MonitorMark-Time-Temperature-Indicators, 2 pages.
ON Semiconductor product page, downloaded on Dec. 12, 2019 from https://www.onsemi.com/PowerSolutions, 2 pages.

* cited by examiner

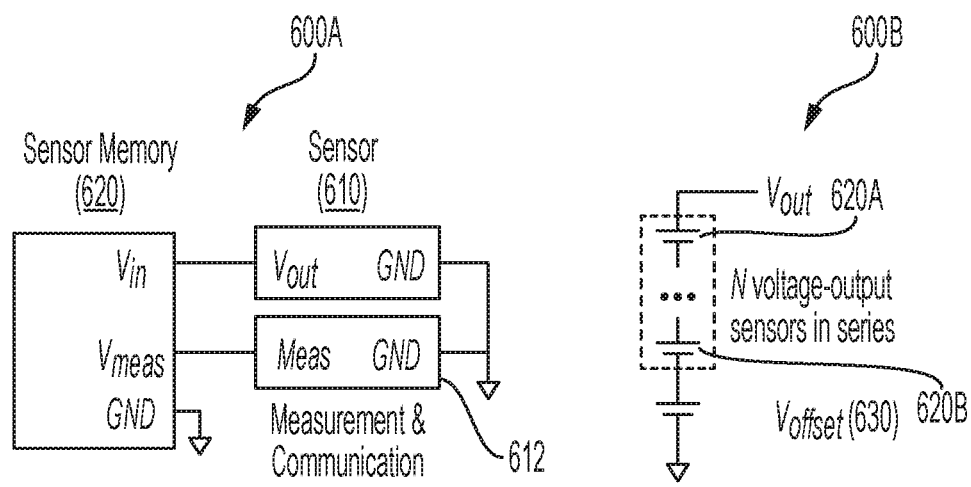
FIG. 6A
FIG. 6B
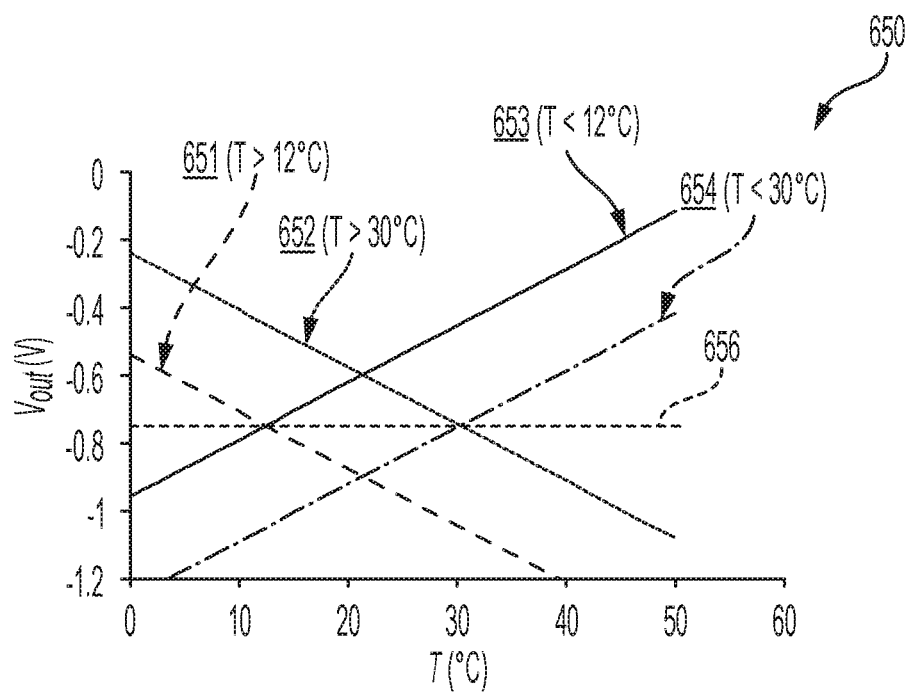
FIG. 6C

LOW-POWER SENSOR MEMORY

TECHNICAL FIELD

The present teachings relate generally to a memory for a sensor and, more particularly, to a low-power memory for a sensor that can record past and present occurrences of a measurement by the sensor that is outside of a predetermined range.

BACKGROUND

Continuous monitoring and/or logging of sensors with conventional electronics requires power (typically 10-100 µA even for conventional low-power electronics). As a result, sensors (also referred to herein as sensor tags) intended for continuous monitoring must include a battery or energy-harvesting element. This increases the cost and complexity of the sensors, thus limiting the available applications for the sensors. On the other hand, passively powered sensors such as near-field communication (NFC) sensors or radio-frequency identification (RFID) sensors can be operated without a battery. However, these sensors only provide information about the current sensor state (i.e., not past measurements).

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

A sensor system is disclosed. The sensor system includes a sensor configured to measure a parameter. The sensor system also includes a memory configured to record one or more occurrences when the parameter is outside of a predetermined range. The memory includes a wire, a counter-electrode, and an electrolyte.

In another embodiment, the sensor system includes a sensor configured to measure a parameter and to output a voltage that is a function of the parameter. The parameter is selected from the group consisting of temperature, pressure, humidity, moisture, vibration, shock, light, oxygen, concentration, pH, and salinity. The sensor system also includes a memory connected to the sensor. The memory includes a wire including a metal or a semiconductor. The memory also includes a counter-electrode including a redox-active material. The memory also includes an electrolyte in contact with the wire and the counter-electrode. The wire and the counter-electrode are configured to receive the voltage from the sensor. The voltage generates an electrical current between the wire and the counter-electrode. The electrical current causes an electrochemical reaction in the wire, the counter-electrode, or both when the parameter is outside of a predetermined range. The electrochemical reaction causes a property of the wire to change. The property is selected from the group consisting of resistance, conductance, impedance, capacitance, inductance, and color.

In another embodiment, the sensor system includes a sensor configured to measure a parameter and to output a voltage that is a function of the parameter. The sensor system also includes a memory connected to the sensor. The memory includes an electrochemical cell. The memory is configured to record one or more past occurrences when the parameter is outside of a predetermined range without recording a value of the parameter. The memory includes a wire including silver. The memory also includes a counter-electrode including poly(3,4-ethylenedioxythiophene) polystyrene sulfonate. The memory also includes an electrolyte including sodium nitrate. The electrolyte is in contact with the wire and the counter-electrode. The memory also includes a membrane between the wire and the counter-electrode. The membrane allows a flow of ions between two separate regions of the electrolyte. The memory also includes a dielectric layer configured to isolate at least a portion of the wire or the counter-electrode from the electrolyte. The wire and the counter-electrode are configured to receive the voltage from the sensor. The voltage generates an electrical current between the wire and the counter-electrode. The electrical current causes an electrochemical reaction in the wire, the counter-electrode, or both when the parameter is outside of the predetermined range. The electrochemical reaction causes corrosion of the wire, which causes a conductance of the wire to decrease. A value of the conductance corresponds to a number of the occurrences when the parameter was outside of the predetermined range.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIG. 6A illustrates another sensor system including a sensor and a memory, according to an embodiment.

FIG. 6B illustrates another sensor system, according to an embodiment.

FIG. 6C illustrates a graph showing the total output voltage of the sensor system from FIG. 6B when different offset voltages and circuit polarities are used, according to an embodiment.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same, similar, or like parts.

The present disclosure is directed to a low-power, low-cost sensor system that can record the occurrence of one or more measurements by a sensor that is/are outside of a predetermined range (e.g., extreme sensor measurements). This allows a user to read the measurements with, for example, a measurement device (e.g., RFID reader) and obtain both current sensor measurements and past sensor measurements without requiring a discrete battery.

The sensor system disclosed herein may provide the advantages of active sensor systems, passive sensor systems, and non-electric sensor systems (which have a property that changes when the measured parameter crosses a threshold). For example, the sensor system may enable wireless electronic monitoring of sensor history including past occurrences where the sensor measurements were outside of the predetermined range. The sensor system also requires no discrete battery or energy-harvesting elements beyond what is already present in existing RFID chips. Further, the sensor system can interface with any sensor that outputs a voltage (i.e., custom sensors don't have to be developed specifically to work with this sensor system). Moreover, the sensor system can be interfaced with both current and next-generation wireless communication protocols (i.e., protocol-agnostic).

Figure 1:
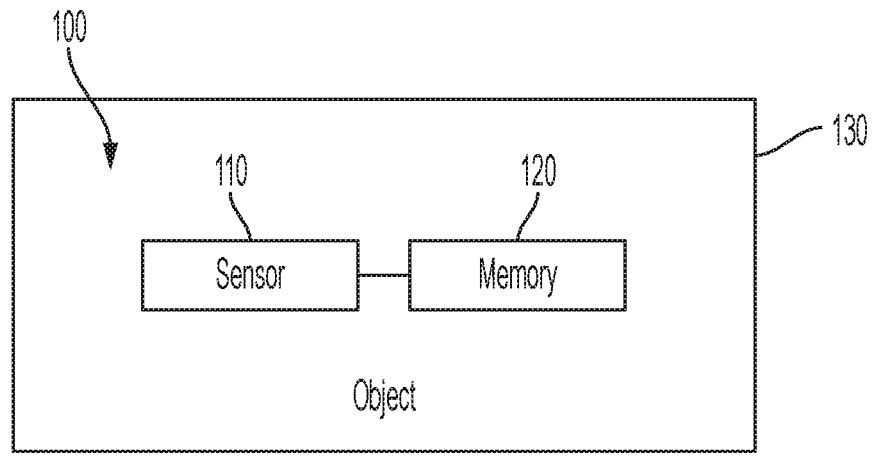
FIG. 1 depicts a schematic view of a sensor system, according to an embodiment.

FIG. 1 depicts a schematic view of a sensor system 100, according to an embodiment. The sensor system 100 may be used, for example, in pharmaceutical supply chains, electronic and/or consumer goods, environmental monitoring, in-wall/in-build leak detection, and the like. The sensor system 100 may include a sensor 110 that is configured to measure one or more parameters. The parameters may be or include physical attributes having a value associated therewith. More particularly, the parameters may be or include temperature, pressure, humidity, moisture, vibration, shock, light, oxygen, the pressure or concentration of a gas, pH, salinity, the concentration of one or more dissolved ions, the concentration of one or more small molecules, or the concentration of one or more bio-molecules (e.g., DNA, RNA, peptides, proteins, carbohydrates, lipids). The parameters may be related to an object 130. In one example, the object 130 may be a package of food that is intended to remain frozen, and the sensor 110 may be configured to measure a temperature of the package of food to monitor whether it remains frozen.

The sensor system 100 may also include a memory (also referred to as a memory element) 120 that is connected to the sensor 110. The memory 120 may be configured to record (e.g., store) the parameter measured by the sensor 110. More particularly, the memory 120 may be configured to record the parameter measured by the sensor 110 when the parameter is outside of a predetermined range. Alternatively, the memory 120 may be configured to record the occurrence of a sensor excursion (i.e., that the parameter measured by sensor 110 is outside of a predetermined range) with or without recording the exact value or degree of the excursion. Continuing with the example above, the memory 120 may be configured to record when the parameter (e.g., temperature) exceeds an upper threshold (e.g., 0° C.). The memory 120 may also or instead be configured to record when the parameter (e.g., temperature) falls below a lower threshold. In at least one embodiment, multiple memory elements 120 can be connected to the same sensor 110 to monitor multiple upper and/or lower sensor limits.

Figure 2:
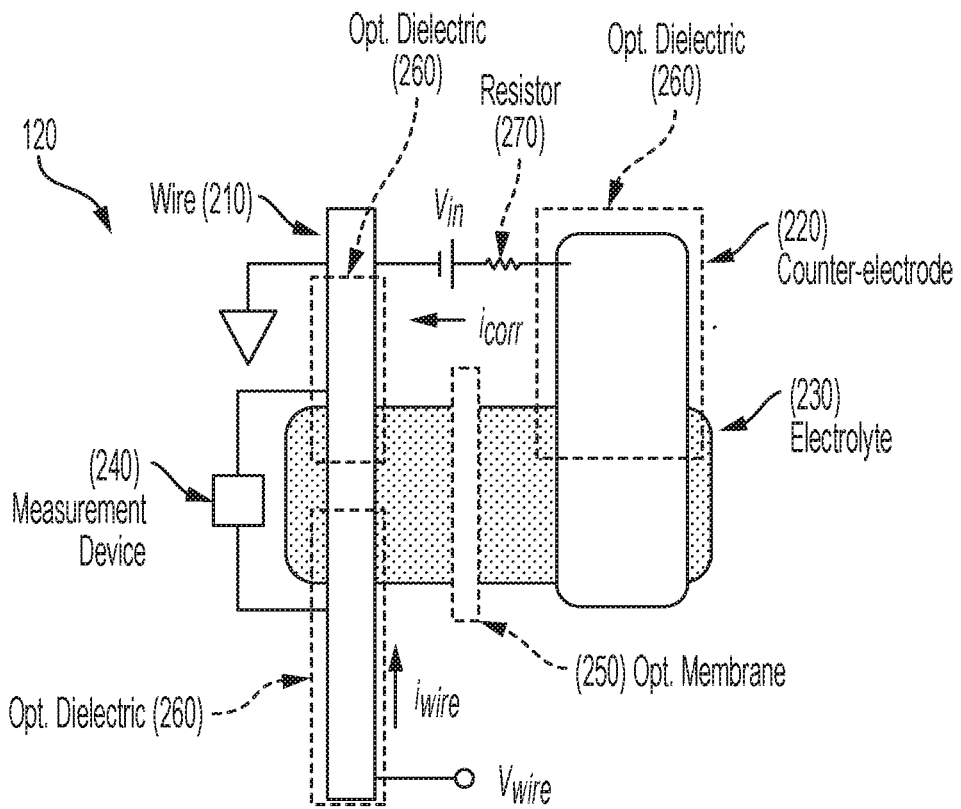
FIG. 2 depicts a schematic view of a memory of the sensor system, according to an embodiment.

FIG. 2 depicts a schematic view of the memory 120 of the sensor system 100, according to an embodiment. The memory 120 may be or include an electrochemical cell. The memory 120 may include a wire 210, a counter-electrode 220, and an electrolyte 230. The wire 210 may be or include a conductor defining a length, and the length may be formable into a closed perimeter. The wire 210 can undergo electrochemical reactions that change a property of the wire 210. The property may be or include a physical attribute of the wire 210 having a value associated therewith. The (physical attribute of the) property may differ from the (physical attribute of the) parameter. For example, the property may be or include resistance/conductance, impedance, capacitance, inductance, color, or a combination thereof. The wire 210 can be metallic or semiconducting, and can include metals, organic semi-metals, inorganic semi-metals, organic semiconductors, polymeric semiconductors, and inorganic semiconductors. More particularly, the wire 210 may include silver, copper, aluminum, silicon, nickel, carbon, alloys thereof, or a combination thereof. Alternatively, the wire 210 may include PEDOT:PSS. As used herein, PEDOT:PSS refers to poly(3,4-ethylenedioxythiophene) polystyrene sulfonate, which may be or include a polymer mixture of two ionomers. In one example, the wire 210 may be or include a printed silver wire with a width between about 20 µm and about 500 µm. The wire 210 can be fabricated on a substrate using a wide variety of approaches, including various printing techniques (e.g., inkjet, gravure, flexography, screen, xerography, laser, etc.), electrodeposition, electroless deposition, sputtering, evaporation, and lamination, among others.

The counter-electrode 220 may be or include an electrode in a multi (e.g., three) electrochemical cell for voltammetric analysis or other reactions in which an electric current flows. The counter-electrode 220 may be or include a material that can be oxidized or reduced. Alternatively, the counter-electrode 220 may serve as a current-collector that allows the electrolyte 230 or a species dissolved in the electrolyte 230 to be oxidized or reduced. The counter-electrode 220 may include a wide range of redox-active materials, including ferricyanide/ferrocyanide, iodide, triiodide, viologen and its derivatives, viologen and its derivatives, metals and their salts (e.g., silver, aluminum, gold, copper, nickel), redox-active inorganic solids (e.g., Prussian blue, intercalation materials, metal oxides, metal phosphates). In one example, the counter-electrode 120 may be or include printed PEDOT:PSS.

The electrolyte 230 may be or include a liquid or gel that contains ions and can be decomposed by electrolysis. The electrolyte 230 may be or include water with dissolved salt (e.g., $NaNO_3$, $Na_2SO_4$, NaCl, and others), an organic solvent with dissolved salt, a polymer with dissolved salt, an ionically conductive inorganic solid, an ionic liquid, or mixtures or composites thereof. For example, the electrolyte 230 may be or include 0.1 M $NaNO_3$ in water, adjusted to pH ~3 with nitric acid.

In one embodiment the conductivity of the electrolyte 230 may be a function of the measured parameter (e.g., humidity, moisture, temperature, etc.), and the corrosion current Lo, may also be controlled via changes in the conductivity of the electrolyte 230, instead of or in addition to changes in the input voltage $V_{in}$. The corrosion current $I_{corr}$ and the input voltage $V_{in}$ are described in greater detail below.

A membrane 250 may be placed between the wire 210 and the counter-electrode 220 that allows the flow of at least some ions between two separate regions of the electrolyte 230. The membrane 250 may be or include a thin, soft, pliable sheet or layer. For example, the membrane 250 may be or include an ion-selective membrane, an ion-conductive glass, or a polymer membrane.

A dielectric layer 260 may be used to isolate the leads of the wire 210 and/or the counter-electrode 220 from the electrolyte 230. The dielectric layer 260 may be or include an electrical insulator that can be polarized by an applied electrical field. The dielectric layer 260 may be or include any suitable organic or inorganic material that blocks the electrolyte 230 from reaching the leads. For example, the dielectric layer 260 may be or include tape that is used to isolate the leads of the wire 210 from the electrolyte 230. In another example, a polymer coating or plastic laminate may be used as the dielectric layer 260.

The sensor 110 may output a voltage which may be a function of the measured parameter (e.g., temperature). The output voltage may be directly proportional to, inversely proportional to, or dependent in a non-linear manner on the parameter. The voltage from the sensor 110 may be received at the memory 120 as an input voltage ($V_{in}$) as shown in FIG. 2. In the example above, as the temperature of the object 130 increases, the input voltage $V_{in}$ also increases, and as the temperature of the object 130 decreases, the input voltage $V_{in}$ also decreases. In another example, as the temperature of the object 130 increases, the input voltage $V_{in}$ decreases, and as the temperature of the object 130 decreases, the input voltage $V_{in}$ increases. The input voltage $V_{in}$ may be connected to (e.g., between) the wire 210 and the counter-electrode 220.

The input voltage $V_{in}$ may cause an electrical current (Icon) between the wire 210 and the counter-electrode 220. At least a portion of the electrical current $I_{corr}$ (e.g., a net flow of electrons) may be participating at electrochemical reactions at the wire 210 and counter-electrode 220. These electrochemical reactions may cause a measurable property of the wire 210 to change, including resistance/conductance, impedance, capacitance, inductance, color, or a combination thereof. The rate of the electrochemical reactions is dependent on the input voltage $V_{in}$ and thus the measured parameter (e.g., temperature).

For any combination of half-reactions occurring at the wire 210 and the counter-electrode 220, there exists a range of input voltages $V_{in}$ where the rate of the half-reactions is negligible. At input voltages $V_{in}$ that are negative (e.g., for oxidation reactions occurring at the wire) or positive (e.g., for reduction reactions occurring at the wire) of this range, the rate of the electrochemical reactions is non-negligible, and a change in the wire's properties occurs. Thus, measured parameters that result in an input voltage $V_{in}$ in this non-negligible voltage range are defined as being outside the predetermined range. For a given sensor 110 and memory 120, the predetermined range for the parameter can be shifted by inverting the polarity of the sensor input (i.e., connecting the sensor's positive terminal to the negative terminal of $V_{in}$) and/or adding constant voltage-sources in series with the sensor 110 (as described below and depicted in FIGS. 6B and 6C).

In one embodiment, a first half-reaction may occur at/in the wire 210, which may be or include oxidation of a metal (e.g., $Ag \Rightarrow Ag^+ + e^-$ or $Cu \Rightarrow Cu^{2+} + 2e^-$). In another embodiment, the half reaction occurring at the wire 210 may include an oxidation or reduction that results in an irreversible change in the carrier mobility within the wire 210, such as the over-oxidation of PEDOT:PSS. In yet another embodiment, the half reaction occurring at the wire 210 may generate gas bubbles, which in turn mechanically damage the wire 210 and reduce its conductivity. In yet another embodiment, the reaction occurring at the wire 210 may be an electroplating or electrodeposition reaction that changes the properties of the wire 210. In addition, a second half-reaction may occur at/in the counter-electrode 220, which may be or include any oxidation or reduction reaction. An illustrative reduction reaction may be or include a reduction of PEDOT ($PEDOT^+ + e^- \Leftrightarrow PEDOT$) followed by an irreversible reaction of reduced PEDOT with oxygen (in acidic media: $4\ PEDOT + O_2 + 4\ H^+ \Rightarrow 4\ PEDOT^+ + 2H_2O$ and $2\ PEDOT + O_2 + 2\ H^+ \Rightarrow 2\ PEDOT^+ + H_2O_2$).

The electrical current $I_{corr}$ and/or the half-reactions may cause metal corrosion in the wire 210. The metal corrosion in the wire 210 may cause one or more properties of the memory 120 to change. For example, the metal corrosion in the wire 210 may cause one or more properties of the wire 210 to change. The properties of the wire 210 that change may be or include, for example, resistance, conductance, impedance, capacitance, inductance, color, or a combination thereof. For example, as the metal corrosion in the wire 210 increases, the resistance of the wire 210 may increase, and the conductance of the wire 210 may decrease.

Thus, when the measured parameter is outside of the predetermined range (e.g., greater than 0° C.), the input voltage $V_{in}$ received from the sensor 110 may generate an electrical current $I_{corr}$ that causes one or more half-reactions in the memory 120. The half-reactions may cause the wire 210 to corrode. The corrosion varies the property of the wire 210 (e.g., causes the resistance to increase and/or the conductance to decrease).

A user may then be able to measure the property of the memory 120. For example, the user may connect a measurement device (e.g., a radio-frequency identification (RFID) circuit) 240 to the wire 210 to measure the electrical current ($I_{wire}$) through the wire 210 to determine the resistance and/or conductance of the wire 210. As described in greater detail below, the measured property (e.g., resistance and/or conductance) may indicate current and/or past occurrences of the measured parameter being outside of the predetermined range.

Figure 3A:
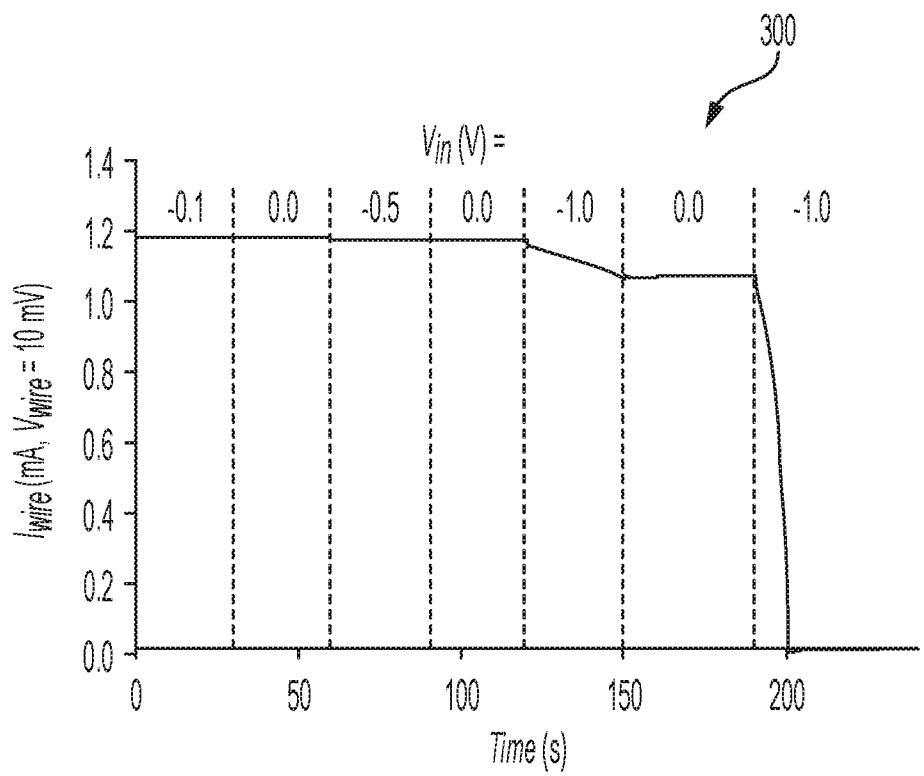
FIG. 3A depicts a graph showing the electrical current $I_{wire}$ through the wire versus time at different input voltage $V_{in}$ values, according to an embodiment.

More particularly, FIG. 3A depicts a graph 300 showing the electrical current $I_{wire}$ through the wire 210 versus time at different input voltage $V_{in}$ values, according to an embodiment. In the example shown in FIG. 3A, the measurement device 240 applies a 10 mV bias voltage across the wire 210 while the input voltage $V_{in}$ applied to the counter-electrode 220 is varied. The electrical current $I_{wire}$ through the wire 210 remained relatively constant at $V_{in} = 0.0$, $V_{in} = -0.1$, and $V_{in} = -0.5$ V. However, the electrical current $I_{wire}$ through the wire 210 decreased rapidly (e.g., to 0 mA) at $V_{in} = -1.0$ V. The values $V_{in} = 0.0$, $V_{in} = -0.1$, and $V_{in} = -0.5$ V correspond to the measured parameter being within the predetermined range, and the value $V_{in} = -1.0$ V corresponds to the measured parameter being outside of the predetermined range.

Figure 3B:
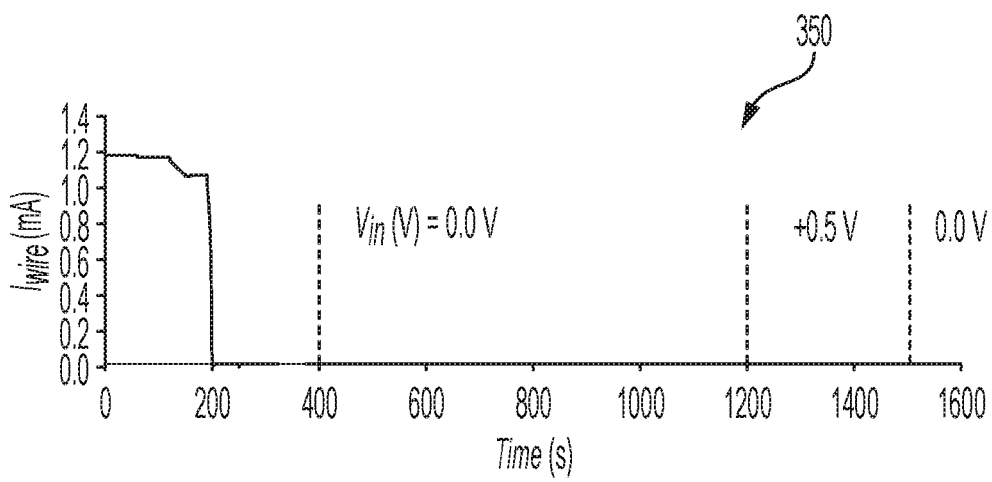
FIG. 3B depicts a graph showing the graph of FIG. 3A extended over a greater time duration, according to an embodiment.

FIG. 3B depicts a graph 350 showing the graph 300 of FIG. 3A extended over a greater time duration, according to an embodiment. The graph 350 includes the application of $V_{in} = 0$ V and $V_{in} = 0.5$ V after the electrical current $I_{wire}$ drops to 0 mA. As may be seen, the application of $V_{in} = 0$ V and $V_{in} = 0.5$ V does not increase the conductance of the wire 210, as the electrical current $I_{wire}$ remains 0 mA. As a result, when a user views the readings from the measurement device 240 (e.g., in the graph 350), the user may conclude that the parameter was measured outside of the predetermined range by the sensor 110 at least once due to the decreased conductance of the wire 210.

In this example, the decrease in the conductance of the wire 210 is substantially irreversible. The irreversible change in the conductance of the wire 210 can be obtained in two ways: 1) by selecting electrolytes 230 that react with silver ions to deposit oxidized silver compounds that are electrically isolated from the silver wire 210, thus preventing their later reduction back to metallic silver; and 2) using an irreversible counter-electrode reaction to limit the backwards current during voltage reversals.

Figure 4:
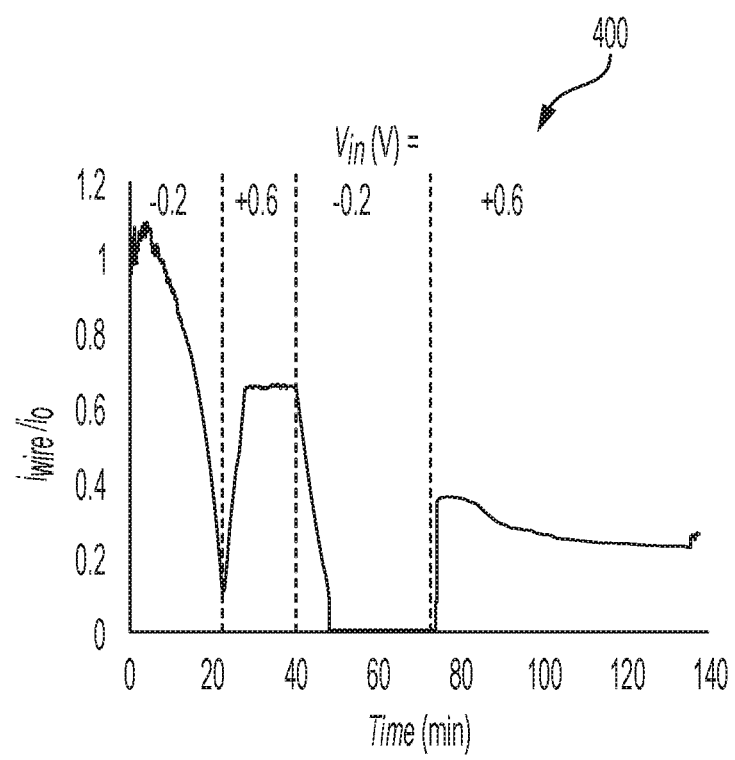
FIG. 4 depicts a graph showing the electrical current through the wire ($I_{wire}$) versus time at different voltage values $V_{in}$, according to an embodiment.

FIG. 4 illustrates results of a different example where the change in the conductance of the wire 210 is reversible. More particularly, FIG. 4 depicts a graph 400 showing the electrical current $I_{wire}$ through the wire 210 versus time at different voltage values $V_{in}$, according to an embodiment. The example of FIG. 4 involves a reversible redox-reaction at the counter-electrode 220 (e.g., $3\ I^- <=> I_2 + I^- + 2\ e^-$).

As shown, an input voltage of $V_{in} = -0.2$ V is applied at time=0 minutes. This causes the electrical current $I_{wire}$ through the wire 210 to decrease rapidly to 0 mA, as in FIGS. 3A and 3B. However, when higher input voltages $V_{in}$ are applied, the decrease in the conductance of the wire 210 may be at least partially reversed. More particularly, a subsequent input voltage of $V_{in} = +0.6$ V at time=20 minutes causes the electrical current $I_{wire}$ to increase to about 0.6 mA. Thus, unlike the example shown in FIGS. 3A and 3B, the conductance of the wire 210 in FIG. 4 is at least partially reversible. Another input voltage of $V_{in} = -0.2$ V is applied at time=40 minutes and causes the electrical current $I_{wire}$ to again decrease rapidly to 0 mA. Another input voltage of $V_{in} = +0.6$ V at time=80 minutes causes the electrical current $I_{wire}$ to increase to about 0.3 mA.

In this example, the value $V_{in} = +0.6$ V corresponds to the measured parameter being within the predetermined range, and the value $V_{in} = -0.2$ V corresponds to the measured parameter being outside of the predetermined range. For example, after an input voltage of $V_{in} = -0.2$ V causes the conductance and the electrical current $I_{wire}$ to decrease, the subsequent input voltage of $V_{in} = +0.6$ V may cause plating to occur on the wire 210, which may cause the conductance and the electrical current $I_{wire}$ to increase.

In addition, as may be seen in FIG. 4, each time the redox-reaction at the counter-electrode 220 is reversed, the electrical current $I_{wire}$ increases, but to a lesser value than the previous time. For example, the electrical current $I_{wire}$ increases to about 0.6 mA after the reversal of the first redox-reaction, and increases to about 0.3 mA after the reversal of the second redox-reaction. In at least one embodiment, the value of the electrical current $I_{wire}$ may directly correspond with the number of times that the parameter (e.g., temperature) is measured outside of the predetermined range (e.g., exceeds 0° C.). For example, a value of $I_{wire} = 0.6$ mA may indicate that the parameter was measured outside the predetermined range one time, a value of $I_{wire} = 0.3$ mA may indicate that the parameter was measured outside the predetermined range two times, a value of $I_{wire} = 0.2$ mA may indicate that the parameter was measured outside the predetermined range three times, and so on.

Figure 5A:
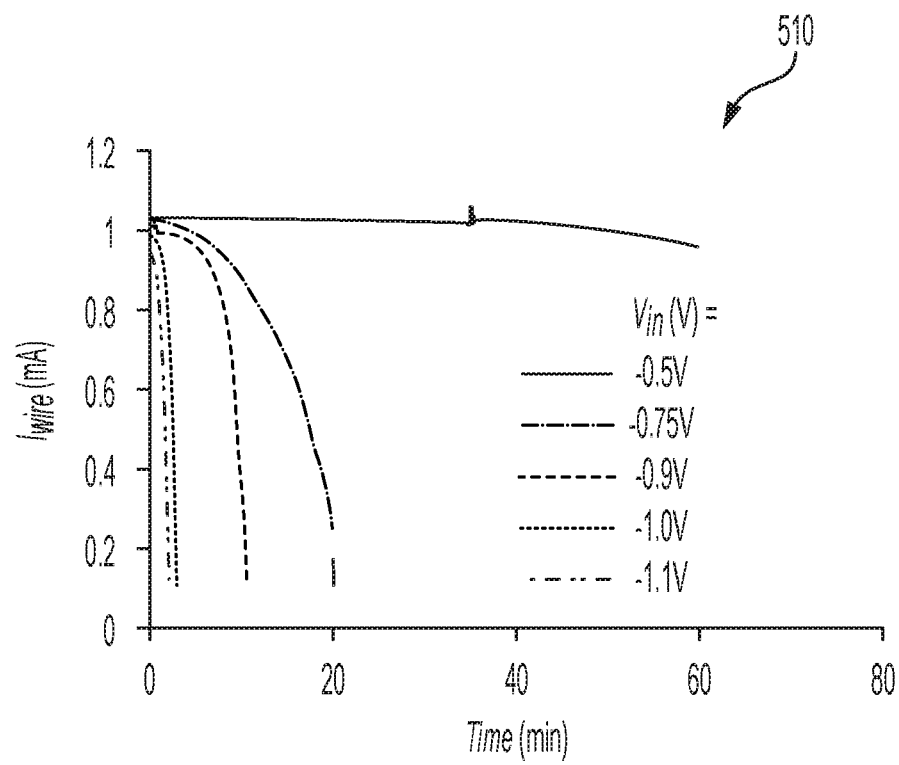
FIG. 5A illustrates a graph showing the electrical current $I_{wire}$ for different input voltages $V_{in}$, according to an embodiment.
Figure 5B:
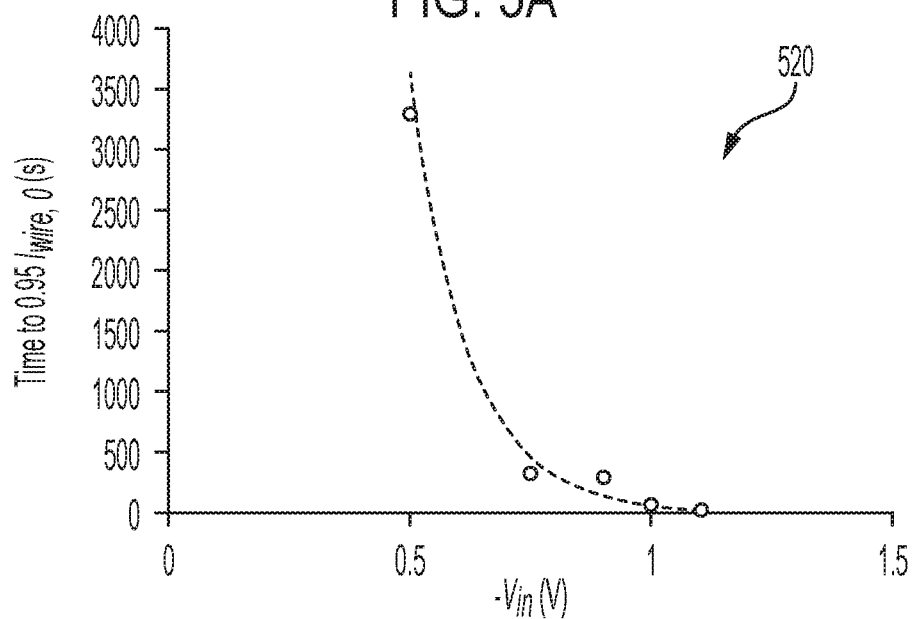
FIG. 5B illustrates a graph showing the time required for a 5% decrease in the electrical current $I_{wire}$ as a function of the input voltage $V_{in}$, according to an embodiment.
Figure 5C:
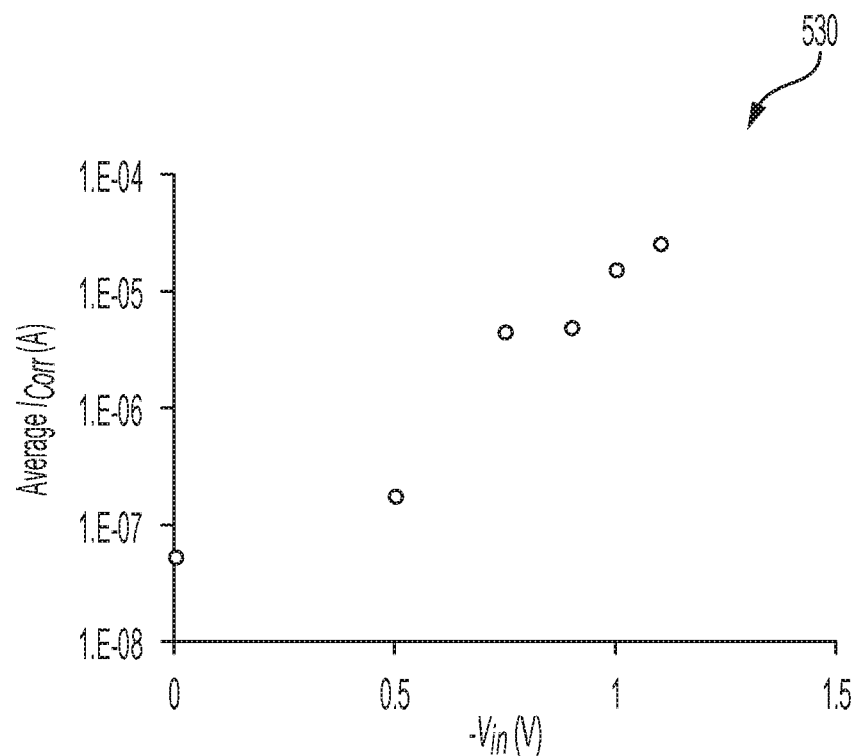
FIG. 5C illustrates a graph showing the average electrical current $I_{corr}$ versus the input voltage $V_{in}$, according to an embodiment.
Figure 5D:
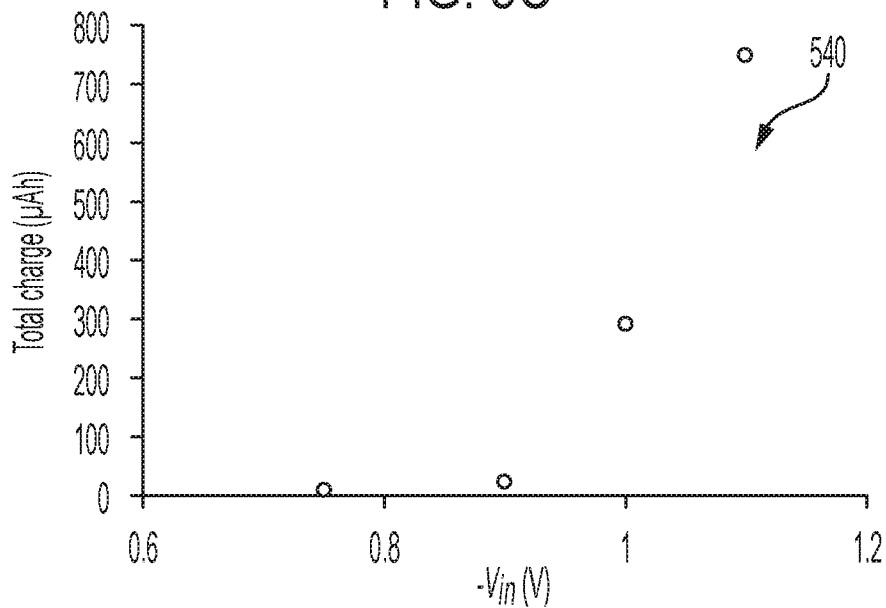
FIG. 5D illustrates a graph showing the total charge required for complete corrosion of the wire versus the input voltage $V_{in}$, according to an embodiment.

FIGS. 5A-5D show the voltage-dependence of the corrosion rate and power consumption of the memory 120. More particularly, FIG. 5A illustrates a graph 510 showing the electrical current $I_{wire}$ for different input voltages $V_{in}$, according to an embodiment. FIG. 5B illustrates a graph 520 showing the time required for a 5% decrease in the electrical current $I_{wire}$ as a function of the input voltage $V_{in}$, according to an embodiment. FIG. 5C illustrates a graph 530 showing the average electrical current $I_{corr}$ versus the input voltage $V_{in}$, according to an embodiment. FIG. 5D illustrates a graph 540 showing the total charge required for complete corrosion of the wire 210 versus the input voltage $V_{in}$, according to an embodiment.

As shown in FIGS. 5A and 5B, the corrosion rate was a strong function of the input voltage $V_{in}$, with the silver wire 210 losing about 5% of its conductance in 3,300 seconds with the input voltage $V_{in} = -0.5$ V, and 340 seconds with the input voltage $V_{in} = -0.75$ V. This strong voltage-dependence allows the sensor system 100 to be used as a sensitive irreversible threshold sensor, with moderate sensor output voltages leading to little or no decrease in conductance, and slightly more extreme sensor outputs causing rapid and irreversible changes in device conductance. The relative rate of switching/corrosion can be further tuned by adding a resistor 270 between the input voltage $V_{in}$ and the counter-electrode 220, by tuning the geometry of the memory 120, and/or by changing the conductivity electrolyte 230. The resistor 270 may have a resistance between about 10 Ohms and about 10 MOhms.

Furthermore, the current-consumption of the memory 120 was extremely low (e.g., <200 nA) at input voltages $V_{in}$ that indicated that the measured parameter was within the predetermined range, and thus little change in resistance occurs. In the examples above, these input voltages $V_{in}$ are about $0.0 \geq V_{in} \geq -0.5$ V). When the input voltage $V_{in}$ was sufficiently negative to allow corrosion of the wire 210, the electrical current consumption increased with decreasing input voltage $V_{in}$, with the average electrical current in the range of 5-50 µA. As shown in FIG. 5D, the total charge required to completely corrode the silver wire 120 was approximately constant at 10-30 µAh for moderate input voltages $V_{in}$ (e.g., $-0.75$ V to $-0.9$ V), and approached 1 mAh at more negative input voltages $V_{in}$, due to additional current-consumption by side-reactions. Thus, the power consumption can be controlled by designing the sensor system 100 to limit these side reactions by limiting the minimum and/or maximum input voltage $V_{in}$ and/or selecting electrode materials and electrolytes 130 that minimize side reactions. Further improvement in current-consumption at both active and inactive input voltages can be achieved via device miniaturization.

FIG. 6A illustrates another sensor system 600A including a sensor 610 and a memory 620, according to an embodiment. The memory 620 may be or include an electrochemical cell. The memory 620 may be similar to the memory 120 described above. The memory 620 is connected to a common ground shared by the sensor 610 and measurement and communication circuits 612. The sensor memory 620 also accepts an input voltage, $V_{in}$, which may be connected to the output voltage, $V_{out}$, of the sensor 610. When the parameter being measured by the sensor 610 is out of a predetermined range, the sensor memory 620 undergoes a measurable change in an electrical property that can be measured by the measurement and communication circuit 612 of the sensor 610. The measurement and communication circuit 612 can be powered on intermittently to measure the properties of the sensor memory 620. This is accomplished by providing a voltage (AC or DC) Meas which is applied to the $V_{meas}$ terminal of the sensor memory 620. Changes in the sensor memory 620 electrical properties can be deduced from changes in the electrical current that flows from Meas or changes in time constant for a charging/discharging voltage to be reached.

FIG. 6B illustrates another sensor system 600B, according to an embodiment. In this embodiment, the sensor system 600B may include one or more electrochemical cells (two are shown: 620A and 620B) placed in series with an optional voltage-offset cell 630. The electrochemical cells 620A, 620B are specifically chosen to exhibit a stimulus-dependent open-circuit voltage. For example, by selecting a redox-couple with a highly temperature-dependent redox potential (e.g., ferrocyanide/ferricyanide) as part of the electrochemical cell 620A, 620B, the voltage of each cell 620A, 620B may be a function of temperature. For example, the electrochemical cell 620A, 620B Ag/AgCl/3M NaCl/10 mM $K_3FeCN_6$, 10 mM $K_4FeCN_6$, 0.1 M NaCl/Pt exhibits an open-circuit voltage of 254 mV–(1.68 mV/° C.)(T–25° C.), where T is the temperature in ° C.

FIG. 6C illustrates a graph 650 showing the total output voltage of the sensor system 600B from FIG. 6B when different offset voltages and circuit polarities are used. For example, line 651 shows the output voltage for a circuit with ten of the temperature-sensitive cells 620A, 620B, etc., a negative electrode connected to ground, and an offset voltage of $V_{offset}$=–3.5 V. If connected to the memory 120 from FIG. 2, the sensor described by line 651 would induce corrosion for T>~12° C.

Higher or lower onset temperatures can be achieved by changing the offset voltage $V_{offset}$. For example, line 652 corresponds to the same cell as line 651, but with an offset voltage of –3.2 V. This increases the onset temperature to ~30° C. On the other hand, sensors that induce corrosion when a lower temperature limit is reached can also be prepared by inverting the polarity of the temperature-sensitive cells (positive electrode connected to ground). For example, lines 653 and 654 correspond to the sensor circuit configured with ten temperature-sensitive cells and offset voltages of +2 and +1.7 V, respectively. If connected to the memory 120 from FIG. 2, these sensors would induce corrosion for T<~12° C. and <~30° C., respectively. In one embodiment, memory input voltages below the line 656 may lead to a measurable change in resistance.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" may include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the present teachings have been illustrated with respect to one or more implementations, alterations and/or modifications may be made to the illustrated examples without departing from the spirit and scope of the appended claims. For example, it may be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It may be appreciated that structural objects and/or processing stages may be added, or existing structural objects and/or processing stages may be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. The terms "couple," "coupled," "connect," "connection," "connected," "in connection with," and "connecting" refer to "in direct connection with" or "in connection with via one or more intermediate elements or members." Finally, the terms "exemplary" or "illustrative" indicate the description is used as an example, rather than implying that it is an ideal. Other embodiments of the present teachings may be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A sensor system, comprising:
   a sensor configured to measure a parameter; and
   a memory configured to record one or more occurrences when the parameter is outside of a predetermined range, wherein the memory comprises:
   a wire;
   a counter-electrode; and
   an electrolyte,
   wherein the wire and the counter-electrode are configured to receive the voltage from the sensor,
   wherein the voltage generates an electrical current between the wire and the counter-electrode,
   wherein the electrical current causes an electrochemical reaction in the wire, the counter-electrode, or both when the parameter is outside of the predetermined range, and
   wherein the electrochemical reaction causes corrosion of the wire, which causes a conductance of the wire to decrease.

2. The sensor system of claim 1, wherein the memory does not record a value of the parameter.

3. The sensor system of claim 1, wherein:
   the wire comprises a conductor that is configured to undergo the electrochemical reaction which changes a property of the wire when the parameter is outside of the predetermined range;
   the counter-electrode comprises a redox-active material that is configured to be oxidized, reduced, or both when the parameter is outside of the predetermined range; and
   the electrolyte comprises water with dissolved salt, an organic solvent with dissolved salt, a polymer with dissolved salt, an ionically conductive inorganic solid, or an ionic liquid.

4. The sensor system of claim 1, further comprising a membrane positioned at least partially between the wire and the counter-electrode, wherein the membrane allows a flow of ions between two regions of the electrolyte, and wherein the membrane comprises an ion-selective membrane, an ion-conductive glass, or a polymer membrane.

5. The sensor system of claim 1, further comprising a dielectric layer that is configured to isolate a portion of the wire from the electrolyte, a portion of the counter-electrode from the electrolyte, or both, wherein the dielectric layer comprises tape, a polymer coating, or a plastic laminate.

6. The sensor system of claim 1, wherein the sensor outputs the voltage which is based at least partially upon the parameter, and wherein the electrochemical reaction causes a property of the wire to change.

7. The sensor system of claim 6, wherein the electrochemical reaction comprises a half-reaction in the wire that comprises oxidation of the wire.

8. The sensor system of claim 6, wherein the electrochemical reaction comprises a half-reaction in the wire that comprises oxidation or reduction that results in an irreversible change in a carrier mobility within the wire.

9. The sensor system of claim 6, wherein the electrochemical reaction comprises a half-reaction in the wire that generates gas bubbles that mechanically damage the wire and decrease the property of the wire, and wherein the property comprises conductivity.

10. The sensor system of claim 6, wherein the electrochemical reaction comprises a half-reaction in the wire that comprises an electroplating reaction or an electrodeposition reaction that changes the property of the wire.

11. The sensor system of claim 6, wherein the electrochemical reaction comprises a half-reaction in the counter-electrode that comprises a reduction reaction.

12. The sensor system of claim 6, wherein the electrochemical reaction comprises a reduction of poly(3,4-ethylenedioxythiophene) (PEDOT) followed by a substantially irreversible reaction of reduced PEDOT with oxygen.

13. The sensor system of claim 6, wherein the change in the property is substantially irreversible.

14. The sensor system of claim 6, wherein the change in the property is at least partially reversible.

15. The sensor system of claim 14, wherein the property comprises the conductance, wherein the conductance decreases from a first value to a second value in response to a first occurrence of the parameter being outside of the predetermined range, wherein the conductance is configured to subsequently be increased to a third value that is between than the first value and the second value in response to application of a voltage to the memory.

16. The sensor system of claim 1, wherein a value of the conductance corresponds to a number of the occurrences when the parameter was outside of the predetermined range.

17. The sensor system of claim 1, wherein the counter-electrode comprises a material that is configured to be oxidized or reduced.

18. The sensor system of claim 1, wherein the counter-electrode serves as a current-collector that allows the electrolyte or a species dissolved in the electrolyte to be oxidized or reduced.

19. The sensor system of claim 1, wherein the counter-electrode comprises a redox-active material.

20. The sensor system of claim 19, wherein the redox-active material comprises ferricyanide, ferrocyanide, iodide, triiodide, viologen and its derivatives, viologen and its derivatives, or a combination thereof.

21. The sensor system of claim 19, wherein the redox-active material comprises metals and their salts, and wherein the metals comprise silver, aluminum, copper, nickel, or a combination thereof.

22. The sensor system of claim 19, wherein the redox-active material comprises redox-active inorganic solids, and wherein the redox-active inorganic solids comprise Prussian blue, intercalation materials, metal oxides, metal phosphates, or a combination thereof.

23. The sensor system of claim 1, wherein the counter-electrode comprises printed PEDOT:PSS.

24. A sensor system, comprising:
a sensor configured to measure a parameter and to output a voltage that is a function of the parameter, wherein the parameter is selected from the group consisting of temperature, pressure, humidity, moisture, vibration, shock, light, oxygen, concentration, pH, and salinity; and
a memory connected to the sensor, wherein the memory comprises:
a wire comprising a metal or a semiconductor;
a counter-electrode comprising a redox-active material; and
an electrolyte in contact with the wire and the counter-electrode,
wherein the wire and the counter-electrode are configured to receive the voltage from the sensor,
wherein the voltage generates an electrical current between the wire and the counter-electrode,
wherein the electrical current causes an electrochemical reaction in the wire, the counter-electrode, or both when the parameter is outside of a predetermined range,
wherein the electrochemical reaction causes corrosion of the wire, which causes a property of the wire to change, and
wherein the property is selected from the group consisting of resistance, conductance, impedance, capacitance, inductance, and color.

25. The sensor system of claim 24, wherein the changed conductance indicates one or more current or past occurrences when the parameter was outside of the predetermined range.

26. The sensor system of claim 25, wherein a value of the conductance corresponds to a number of the occurrences when the parameter was outside of the predetermined range.

27. A sensor system, comprising:
a sensor configured to measure a parameter and to output a voltage that is a function of the parameter; and
a memory connected to the sensor, wherein the memory comprises an electrochemical cell, wherein the memory is configured to record one or more past occurrences when the parameter is outside of a predetermined range without recording a value of the parameter, and wherein the memory comprises:
a wire comprising silver;
a counter-electrode comprising poly(3,4-ethylenedioxythiophene) polystyrene sulfonate;
an electrolyte comprising sodium nitrate, wherein the electrolyte is in contact with the wire and the counter-electrode;
a membrane between the wire and the counter-electrode, wherein the membrane allows a flow of ions between two separate regions of the electrolyte; and
a dielectric layer configured to isolate at least a portion of the wire or the counter-electrode from the electrolyte,
wherein the wire and the counter-electrode are configured to receive the voltage from the sensor, wherein the voltage generates an electrical current between the wire and the counter-electrode, wherein the electrical current causes an electrochemical reaction in the wire, the counter-electrode, or both when the parameter is outside of the predetermined range, wherein the electrochemical reaction causes corrosion of the wire, which causes a conductance of the wire to decrease, and wherein a value of the conductance corresponds to a number of the occurrences when the parameter was outside of the predetermined range.

\* \* \* \* \*